(12) United States Patent
Zhou et al.

(10) Patent No.: US 11,328,980 B2
(45) Date of Patent: May 10, 2022

(54) AUTOMOTIVE POWER DEVICES ON DIRECT BOND COPPER EMBEDDED IN PCB DRIVER BOARDS

(71) Applicants: Toyota Motor Engineering & Manufacturing North America, Inc., Plano, TX (US); Toyota Jidosha Kabushiki Kaisha, Toyota (JP)

(72) Inventors: Feng Zhou, Ann Arbor, MI (US); Shohei Nagai, Aichi (JP)

(73) Assignees: Toyota Motor Engineering & Manufacturing North America, Inc., Plano, TX (US); TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 16/925,953

(22) Filed: Jul. 10, 2020

(65) Prior Publication Data
US 2022/0013431 A1   Jan. 13, 2022

(51) Int. Cl.
| | |
|---|---|
| H01L 23/373 | (2006.01) |
| H05K 1/02 | (2006.01) |
| H01L 23/498 | (2006.01) |
| H01L 23/00 | (2006.01) |

(52) U.S. Cl.
CPC .... *H01L 23/3735* (2013.01); *H01L 23/49827* (2013.01); *H01L 24/32* (2013.01); *H05K 1/0209* (2013.01); *H01L 2224/04105* (2013.01); *H01L 2224/29147* (2013.01)

(58) Field of Classification Search
CPC ............... H01L 23/3735; H01L 24/32; H01L 23/49827; H01L 25/0655; H01L 2224/04105; H01L 2924/13055; H05K 1/0209
See application file for complete search history.

(56) References Cited

U.S. PATENT DOCUMENTS

| | | |
|---|---|---|
| 6,710,463 B2 | 3/2004 | Choi |
| 9,287,231 B2 | 3/2016 | Chen |
| 9,338,877 B2 | 5/2016 | Robert |

(Continued)

FOREIGN PATENT DOCUMENTS

WO     2020071185 A1     4/2020

*Primary Examiner* — Jasmine J Clark
(74) *Attorney, Agent, or Firm* — Dinsmore & Shohl LLP

(57) ABSTRACT

A power device embedded PCB includes a printed circuit board having a first major surface separated by a thickness and opposite a second major surface and an embedded power device. The embedded power device may include a power semiconductor device, an electrically and thermally conductive substrate bonded to the power semiconductor device along a first surface of the electrically and thermally conductive substrate and bonded to an electrical insulation layer on a second surface of the electrically and thermally conductive substrate opposite the first surface and a thermally conductive substrate bonded to the electrical insulation layer on a surface opposite the bonded electrically and thermally conductive substrate. The power semiconductor device, the electrically and thermally conductive substrate, the electrical insulation layer, and the thermally conductive substrate are disposed within the printed circuit board. The thermally conductive substrate forms a bondable surface adjacent the second major surface of the printed circuit board.

20 Claims, 5 Drawing Sheets

(56) References Cited

U.S. PATENT DOCUMENTS

| | | | |
|---|---|---|---|
| 2015/0223320 A1* | 8/2015 | Gerhauβer | H05K 3/303 361/762 |
| 2016/0049354 A1* | 2/2016 | Kearney | H01L 23/473 361/699 |
| 2019/0221521 A1 | 7/2019 | Hohlfeld et al. | |
| 2020/0028321 A1 | 1/2020 | Liu et al. | |

* cited by examiner

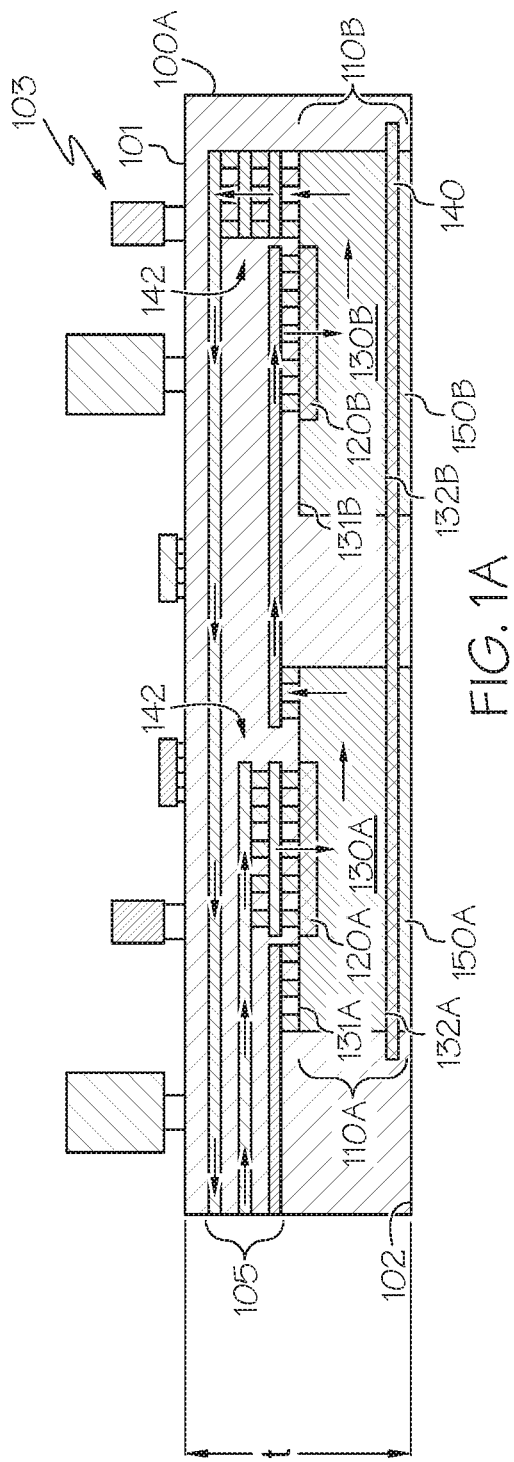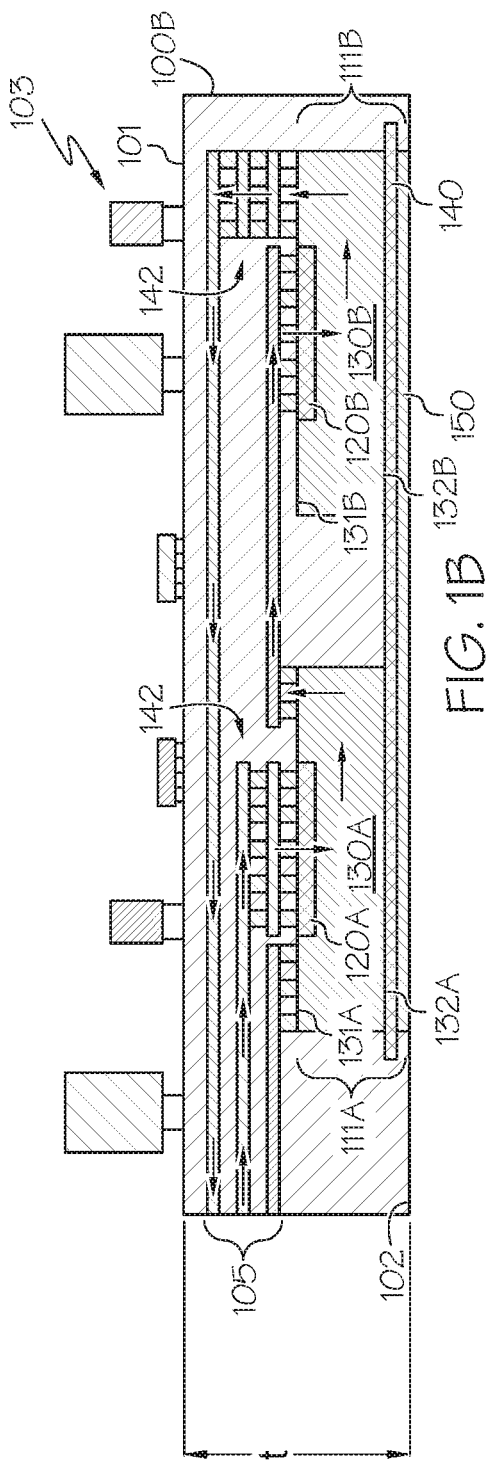

AUTOMOTIVE POWER DEVICES ON DIRECT BOND COPPER EMBEDDED IN PCB DRIVER BOARDS

TECHNICAL FIELD

The present specification generally relates to improved power electronics structures, and more specifically to devices that include a substrate with an insulation layer (e.g., direct bond copper, (DBC)) and embedded in the gate drive board, which provide higher power density and better cooling.

BACKGROUND

Power control units (PCUs) include power cards having power devices, cooling device(s), gate drivers, printed circuit board (PCB), capacitors, and other components. A component of the PCU is a power card, which contains power devices that may be switched on and off in high frequency during operation of the vehicle. These power devices may generate significant amounts of heat. Conventional power cards have designs for exposing surface area of the power devices for cooling purposes. Some PCU configurations include power cards that are sandwiched within liquid cooled units to maintain a proper temperature while they are switching on and off, because switching generates heat. Furthermore, the power cards are connected to the driver board through pin connections. Such power cards may be mounted to a driver board via pins and may extend a distance from the driver board, leading to a larger volume profile to effect cooling. In some current configurations, power devices are attached to a copper substrate and the substrate is connected to the bottom copper layer of a printed circuit board through copper vias for cooling. In such a design, an electrical insulation layer and a grease layer are needed between the PCB and the cooling surface. The vias from the bottom of the copper substrate to the copper layer on the bottom of the PCB and the external grease layers are not effective thermal paths. That is, a large thermal resistance exists between the devices and the cooling surface. Accordingly, improvements within the PCU structure is needed to improve cooling and compactness of the PCU.

SUMMARY

In one aspect, a power device embedded PCB includes a printed circuit board having a first major surface separated by a thickness and opposite a second major surface and an embedded power device. The embedded power device may include a power semiconductor device, an electrically and thermally conductive substrate bonded to the power semiconductor device along a first surface of the electrically and thermally conductive substrate and bonded to an electrical insulation layer on a second surface of the electrically and thermally conductive substrate opposite the first surface and a thermally conductive substrate bonded to the electrical insulation layer on a surface opposite the bonded electrically and thermally conductive substrate. The power semiconductor device, the electrically and thermally conductive substrate, the electrical insulation layer, and the thermally conductive substrate are disposed within the printed circuit board between the first major surface and the second major surface. The thermally conductive substrate forms a bondable surface adjacent the second major surface of the printed circuit board.

In some aspects, a power device embedded PCB includes a printed circuit board having a first major surface separated by a thickness and opposite a second major surface and an embedded power device. The embedded power device includes a power semiconductor device, an electrically and thermally conductive substrate bonded to the power semiconductor device along a first surface of the electrically and thermally conductive substrate and bonded to an electrical insulation layer on a second surface of the electrically and thermally conductive substrate opposite the first surface, and a plurality of vias extending from the electrical insulation layer to the second major surface of the printed circuit board whereby a bondable surface adjacent the second major surface of the printed circuit board is formed. The power semiconductor device, the electrically and thermally conductive substrate, the electrical insulation layer, and the plurality of vias are disposed within the printed circuit board between the first major surface and the second major surface.

In some aspects, a power device embedded PCB includes a printed circuit board having a first major surface separated by a thickness and opposite a second major surface and an embedded power device. The embedded power device includes a power semiconductor device and an electrically and thermally conductive substrate bonded to the power semiconductor device along a first surface of the electrically and thermally conductive substrate and a second surface of the electrically and thermally conductive substrate opposite the first surface forms a bondable surface adjacent the second major surface of the printed circuit board. The electrically and thermally conductive substrate includes a flange positioned along an edge extending from the first surface to the second surface. The power semiconductor device and the electrically and thermally conductive substrate are disposed within the printed circuit board between the first major surface and the first surface of the electrically and thermally conductive substrate. The power control unit further includes one or more conductive power layers embedded within the printed circuit board and electrically coupled to the power semiconductor device along the first surface of the embedded power device.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

FIG. 1A schematically depicts a cross-sectional view of an example printed circuit board having an embedded power device, according to one or more embodiments shown and described herein;

FIG. 1B schematically depicts a cross-sectional view of another example printed circuit board having an embedded power device, according to one or more embodiments shown and described herein;

DETAILED DESCRIPTION

Figure 2A:
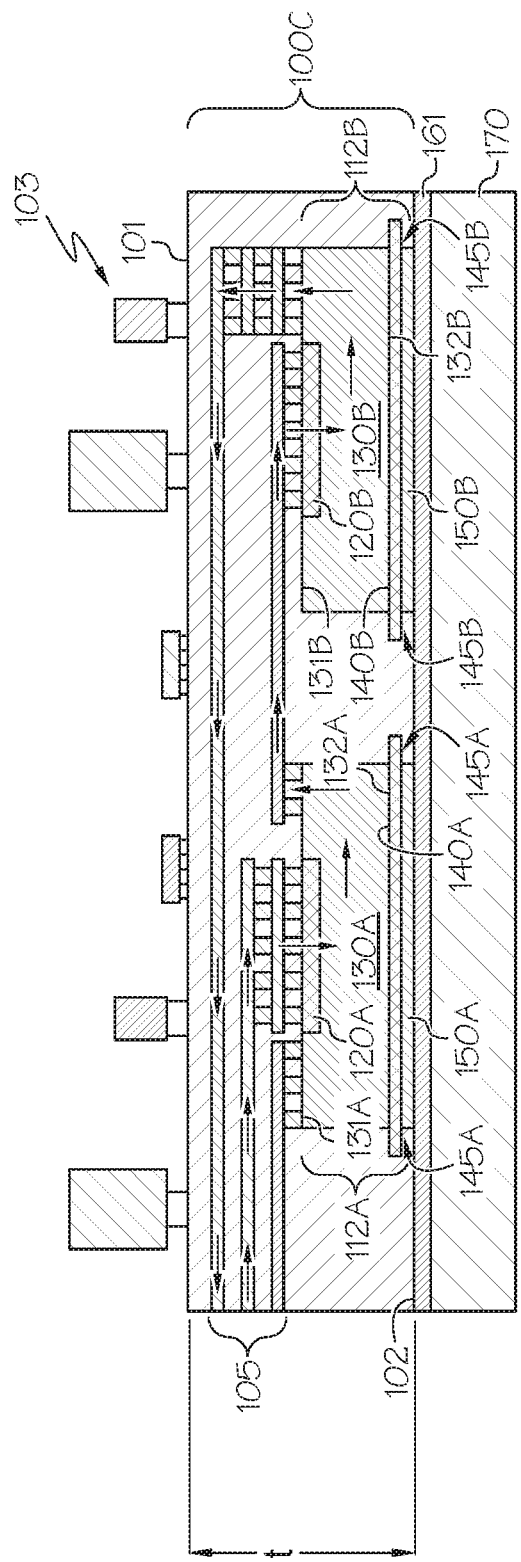
FIG. 2A schematically depicts a cross-sectional view of an example electronics assembly having a printed circuit board with an embedded power device coupled to a cold plate, according to one or more embodiments shown and described herein.

Embodiments of the present disclosure include various embodiments that provide a solution for embedding power devices into a gate driver printed circuit board (PCB) for automotive power electronics and other power systems. The embedded power devices shown and described herein utilize copper layers and/or copper vias to form inverter, convertor, or similar topology. Various configurations are shown and described herein. Each structure includes advantages over traditional topologies. For example, the power device embedded PCB provide smaller system volumes, lighter system weight, higher system power density (e.g., power device embedded PCBs have power devices configured to operate at 40 kW or more), lower overall inductances that deliver smaller switching losses especially at high switching frequency, overall lower cost, and easier fits into new and unique locations within a vehicle, such as mounted within wheels.

Furthermore, embodiments described herein propose various embedded power semiconductor devices within a PCB. The topologies further provide improved cooling of the system by reducing and/or eliminating thermal resistance layers between the power semiconductor devices and coolers such as vapor chambers and/or cold plates. By doing so, the device can maintain lower running temperatures with the same cooler performance or run at a higher power output as heat may be removed more efficiently. Embodiments shown and described herein reduce and/or eliminate the external electrical isolation layer (and grease layer) and provide a more direct and improved thermal conductive path for removing heat from a power semiconductor device.

Some electronic assemblies include an embedded power device that is coupled to a cold plate through an electrical insulation layer positioned outside the printed circuit board and coupled thereto via a grease layer or the like. The two attached surfaces, for example, the insulation layer and the cold plate, are flat but have surface roughness. This causes contact thermal resistance. Grease layer may be used to fill up these small micro cavities on the two surfaces for better heat transfer from one surface to the other. That is, the grease layer reduces is the contact thermal resistance.

Some configurations include a PCB having power devices embedded therein. The power devices may be bonded to copper substrates. The copper substrates, because of the need to electrically couple one or more conductive power layers from one or more surfaces of the power device, the power devices must be electrically isolated outside of the PCB, which reduces the thermal conductivity of the power control unit.

In general, typical power device embedded PCB configurations utilize the electrical conductive properties of the copper substrates to connect to the power devices through a second surface, for example, the bottom of the copper substrates via vias. However, since the copper substrates are coupled via one or more vias, the thermal conductance from the power devices and the copper substrates is reduced since a cold plate and/or vapor chamber may not be bonded to the copper substrates but rather to the power devices through vias and one or more copper layers used to electrically couple and control the power devices. That is, due to power layers connecting to the power devices from a first surface and a second surface of the power device, vias are needed and thus restrict thermal conduction from the copper substrates and the corresponding power devices.

Accordingly, typical power device embedded PCB configurations connect an electrical insulation layer via one or more grease layers to a cold plate and optionally another electronic device such as a power capacitor that needs to be cooled. Other traditional embodiments connect an electrical insulation layer via one or more grease layers to a vapor chamber and/or a cold plate and optionally another electronic device such as a power capacitor that needs to be cooled.

In contrast, embodiments according to the present disclosure provide electronic assembly configurations that improve thermal conductivity of the power device embedded PCB. In particular, some embodiments implement a direct bonded insulation device such as a direct bonded copper substrate, a direct bonded aluminum device, or an active metal bonding substrate to the power semiconductor device and directly to a vapor chamber and/or a cold plate. Furthermore, embodiments shown and described herein provide new configurations for providing the one or more conductive power layers that electrically couple a power system to the power semiconductor device. For example, the one or more conductive power layers are relocated to a common surface so that an opposing surface may be directly bonded to thermal conductive materials for directly removing heat from the power device embedded PCB.

As shown and described herein, new configurations of the one or more conductive power layers and implementation of advanced direct bonded insulation devices within the PCB with the power semiconductor devices allows for more direct coupling of cooling devices such as cold plates and/or vapor chambers. Turning now to the figures, FIGS. 1A-4 depict various configurations that provide more direct bonding of cooling devices to the power devices thereby improving thermal conductance within the electronics assembly as compared to traditional configurations.

Referring to FIGS. 1A and 1B, cross-sectional views of example printed circuit boards 100A (FIG. 1A) and 100B (FIG. 1B) having embedded power devices 110A and 110B (FIG. 1B) and embedded power devices 111A, 111B (FIG. 1B), respectively, are depicted. Referring first to FIG. 1A, a PCB 100A is depicted having a first major surface 101 (e.g., a top surface) and a second major surface 102 (e.g., a bottom surface) opposite the first major surface and separated by a thickness (t) of PCB material. The PCB 100A includes both embedded layers and a surface layer having one or more passive components or active components 103 such as logic circuits. The one or more passive components or active components 103 may include resistors, capacitors, inductors, diodes, oscillators, transistors, integrated circuits, switches, terminals or the like. The PCB 100A also includes one or more power conductive layers 105 configured to provide electrical power to and from the power semiconductor devices 120A, 120B embedded within the PCB 100A by way of vias 142. The PCB 100A (and other example PCBs disclosed herein) may include one or more additional copper layers above one or more power conductive layers 105 for signal connections between the components on the top surface (e.g., the first major surface 101) and the one or more embedded power semiconductor devices 120A, 120B. These layers may be referred to generally as a logic layer.

PCB materials may include any known or yet to be discovered materials, for example, without limitation, FR-2 (phenolic cotton paper), FR-3 (cotton paper and epoxy), FR-4 (woven glass and epoxy), FR-5 (woven glass and epoxy), FR-6 (matte glass and polyester), G-10 (woven glass and epoxy), CEM-1 (cotton paper and epoxy), CEM-2 (cotton paper and epoxy), CEM-3 (non-woven glass and epoxy), CEM-4 (woven glass and epoxy), CEM-5 (woven glass and polyester), PTFE (Polytetrafluoroethylene), RF-35 (fiberglass-reinforced ceramics-filled PTFE), alumina, polyimide. PCB material may be a laminate, cloth or fiber material, resin, silicon, polymer, or the like. PCB material may be chosen based on the temperature range (e.g., the operating temperature) of the embedded power semiconductor device.

The power semiconductor devices 120A, 120B and any others depicted and described herein may include one or more semiconductor devices such as, but not limited to, an insulated gate bipolar transistor (IGBT), a reverse conducting IGBT (RC-IGBT), a metal-oxide-semiconductor field-effect transistor (MOSFET), a power MOSFET, a diode, a transistor, and/or combinations thereof. In some embodiments, the plurality of power semiconductor devices 120A, 120B may include a wide-bandgap semiconductor, and may be formed from any suitable material such as, but not limited to, silicon carbide (SiC), silicon dioxide ($SiO_2$), aluminum nitride (AlN), gallium nitride (GaN), and boron nitride (BN), and the like. In some embodiments, the plurality of power semiconductor devices 120A and 120B operate at high current and/or high power (for example, greater than or equal to 5 kW, 10 kW, 20 kW, 30 kW, 40 kW, 50 kW, 60 kW, 70 kW, 80 kW, 90 kW, 100 kW, 110 kW, 120 kW, 130 kW, 140 kW, or 150 kW or any value therebetween 5 kW and 150 kW) and under high temperatures (for example, in excess of 100° C., 150° C., 175° C., 200° C., 225° C., or 250° C.) and generate a large amount of heat that must be removed for the continued operation of the example power semiconductor devices 120A, 120B.

Traditional embodiments of embedded power devices cannot handle the heat generated by high power semiconductor devices because the thermal conductance paths from the power semiconductor device to a vapor chamber and/or cold plate have undesirable thermal resistances. These thermal resistances are the result of small isolated paths such as vias used for electrical power delivery, which are configured between one or more conductive layers that prohibit the ability for more direct bonding of a cold plate to a direct bonding layer and thus a low thermal resistance path. However, present embodiments reconfigure the conductive power layers to a single side of the power semiconductor device. The reconfiguration makes the opposite side of the power semiconductor device available for direct or at least more direct thermal conductance paths for extracting heat from the power semiconductor device.

The plurality of power semiconductor devices 120A, 120B may be controlled by the gate drive device (not shown) in the PCB 100A to change a current type between an alternating current to a direct current, for example.

In embodiments described herein, the power semiconductor devices 120A, 120B may be bonded to an electrically and thermally conductive substrate 130A, 130B, respectively. For example, the power semiconductor device 120A may be bonded the electrically and thermally conductive substrate 130A on a first surface 131A of the electrically and thermally conductive substrate 130A. Similarly, for example, the power semiconductor device 120B may be bonded the electrically and thermally conductive substrate 130B on a first surface 131B of the electrically and thermally conductive substrate 130B. The electrically and thermally conductive substrates 130A, 130B may include copper, aluminum, gold, silver, or other metals or alloys. The electrically and thermally conductive substrates 130A, 130B may include a cavity sized and shaped to receive one or more of the power semiconductor devices 120A, 120B to provide a close mating between the power semiconductor devices 120A, 120B and the respective electrically and thermally conductive substrates 130A, 130B. However, this is not a requirement as the power semiconductor devices 120A, 120B may be bonded to their respective electrically and thermally conductive substrates 130A, 130B.

The embedded power devices 110A, 110B further include an electrical insulation layer 140 bonded to the electrically and thermally conductive substrates 130A, 130B. For example, the electrical insulation layer 140 may be bonded to a second surface 132A of the electrically and thermally conductive substrates 130A. Similarly, for example, the electrical insulation layer 140 may also be bonded to a second surface 132B of the electrically and thermally conductive substrates 130B. The electrical insulation layer 140 may be further bonded to one or more thermally conductive substrates 150A, 150B, respectively, on a surface opposite bonded electrically and thermally conductive substrates 130A, 130B. As used herein, the electrically and thermally conductive substrate 130A, 130B, the electrical insulation layer 140, and the thermally conductive substrate 150A, 150B define a direct bonded insulation device. The direct bonded insulation device may be a direct bonded copper substrate, a direct bonded aluminum device, or an active metal bonding substrate. The electrical insulation layer 140 may be a ceramic or similar material capable of good thermal conductivity and electrical isolation. Furthermore, the thermally conductive substrates 150A, 150B may be thermally conductive and/or electrically conductive material such as copper, aluminum, and the like.

As depicted in FIG. 1A, in one embodiment, the electrical insulation layer 140 may extend across a layer of the PCB 100A such that two or more embedded power devices 110A, 110B may be electrically isolated by the electrical insulation layer 140. FIG. 1B generally depicts the same configuration as depicted in FIG. 1A, however, in FIG. 1B the electrical insulation layer 140 and the thermally conductive substrate 150A, 150B may extend across a layer of the PCB 100A such that two or more embedded power devices 110A and/or 110B may be electrically isolated and thermally connected to a cooling device (not shown in FIGS. 1A and 1B). The thermally conductive substrate 150A, 150B forms a bondable surface adjacent the second major surface 102 of the PCBs 100A, 100B. The bondable surface may be a layer of the PCB such as a copper, aluminum, or other alloy or metal layer formed within and adjacent the second major surface 102 of the PCBs 100A, 100B.

Figure 2B:
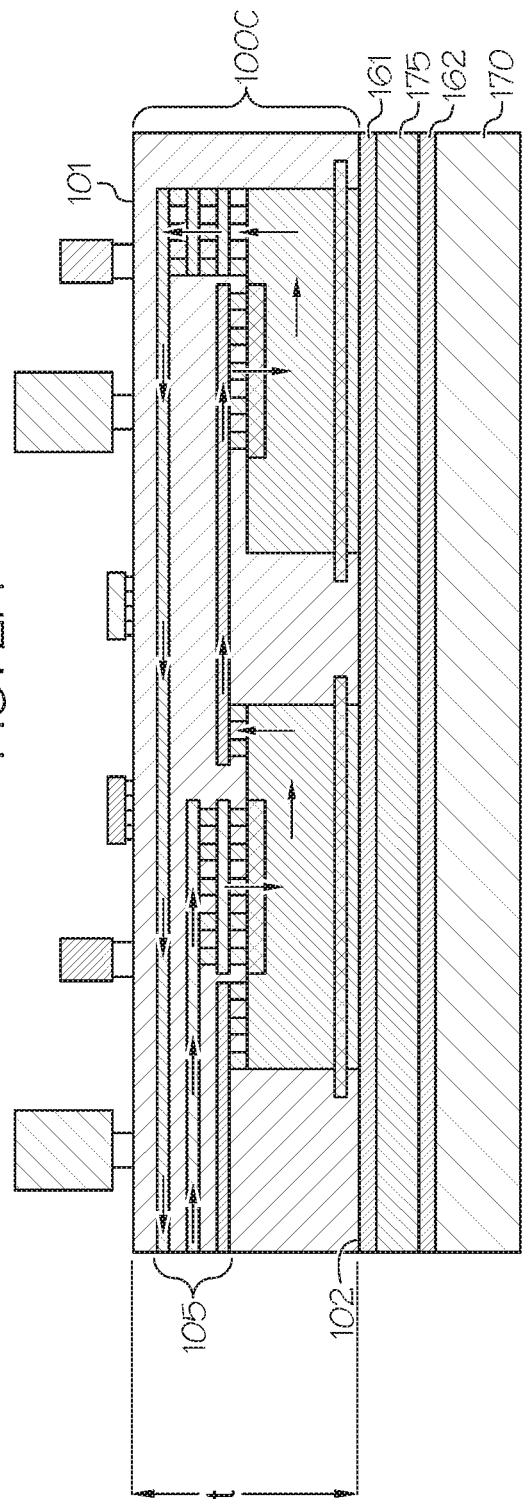
FIG. 2B schematically depicts a cross-sectional view of another example electronics assembly having a printed circuit board with an embedded power device coupled to a vapor chamber and a cold plate, according to one or more embodiments shown and described herein.

Referring to FIGS. 2A and 2B, another configuration of a PCB 100C is depicted. Additionally, FIG. 2A depicts the PCB 100C bonded to a cold plate 170 and FIG. 2B depicts the PCB 100C bonded to a vapor chamber 175 and a cold plate 170. The vapor chamber 175 and/or the cold plate 170 may have grease layers or sintering layers 161, 162 that improves the thermal connection between the cooling devices and the second major surface of the PCB 100A, 100B or 100C. The grease layers or sintering layers 161, 162 may be layers used to physically and/or thermally couple the vapor chamber 175 and/or the cold plate 170 to the PCB 100C.

For brevity only, differences between the PCB 100C depicted in FIG. 2A and PCBs 100A and 100B depicted in FIGS. 1A and 1B, respectively, is discussed herein. PCB 100C includes two embedded power devices 112A, 112B; however this is only an example. Some embodiments may include one or more than one embedded power device. The embedded power devices 112A, 112B, unlike the embedded power devices 110A, 110B, 111A, 111B depicted in FIGS. 1A and 1B, are configured with separate electrical insulation layers 140A, 140B and separate thermally conductive substrates 150A, 150B. Furthermore, in some embodiments, the electrical insulation layers 140A, 140B has a cross-sectional width that is wider than a cross-sectional width of the electrically and thermally conductive substrate 130A, 130B. The flanges 145A, 145B formed by the wider width of the electrical insulation layers 140A, 140B provides additional support for holding the embedded power devices 112A, 112B within the PCB 100C. That is, the flanges 145A, 145B may prevent the embedded power devices 112A, 112B from falling out of the PCB 100C.

Figure 3A:
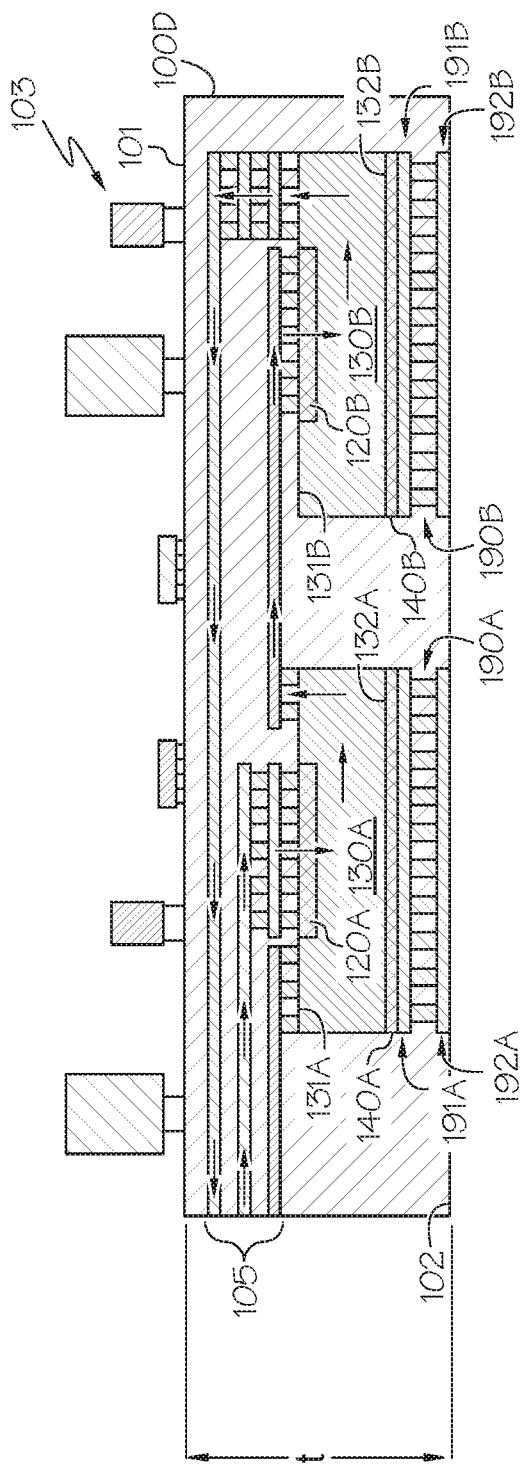
FIG. 3A schematically depicts a cross-sectional view of another illustrative example of a printed circuit board having an embedded power device and a plurality of vias, according to one or more embodiments shown and described herein.
Figure 3B:
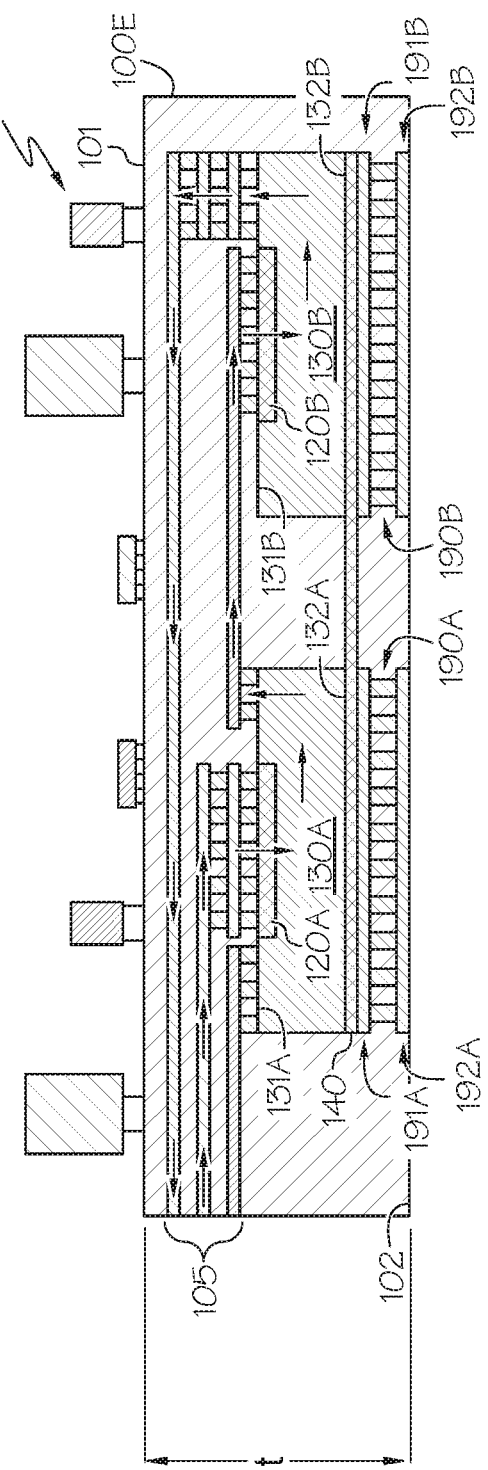
FIG. 3B schematically depicts a cross-sectional view of another illustrative example of a printed circuit board having an embedded power device and a plurality of vias, according to one or more embodiments shown and described herein.
Figure 3C:
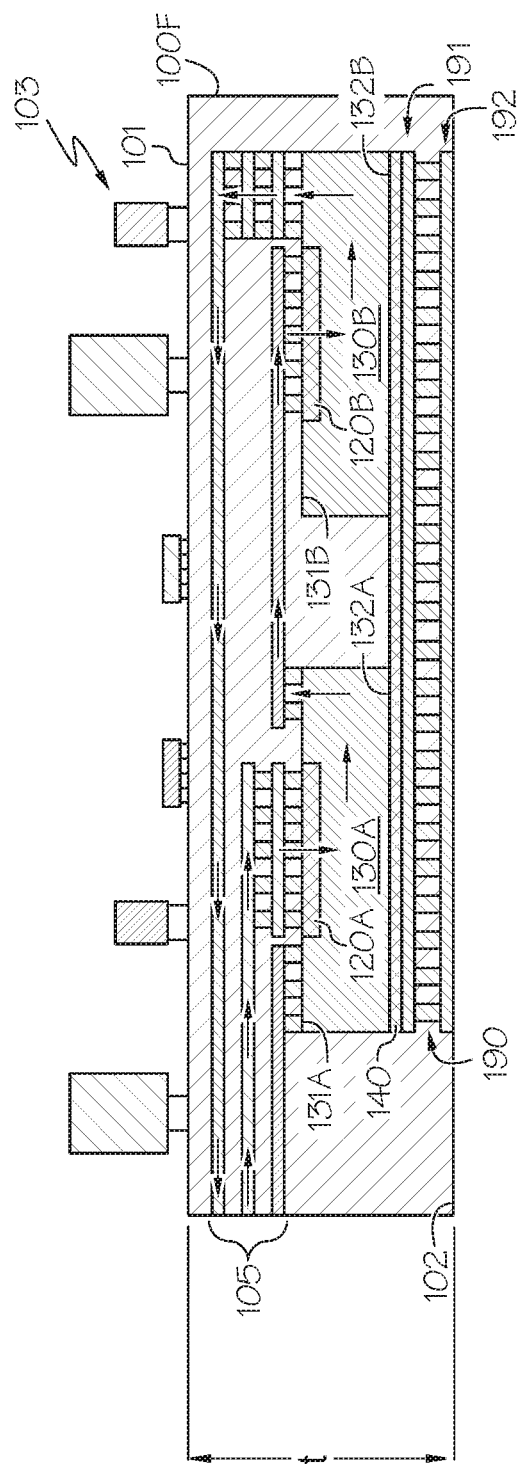
FIG. 3C schematically depicts a cross-sectional view of another illustrative example of a printed circuit board having an embedded power device and a plurality of vias, according to one or more embodiments shown and described herein.

Turning now to FIGS. 3A-3C, a plurality of additional configurations of printed circuit boards 100D, 100E, 100F having an embedded power devices and a plurality of vias 190 or 190A and/or 190B are depicted. In particular, in place of the thermally conductive substrate 150A, 150B depicted and described in FIGS. 1A-2B, a plurality of vias are implemented to form a bondable surface adjacent the second major surface 102 of the printed circuit boards 100D, 100E, 100F.

Referring to FIG. 3A, a PCB 100D is depicted having a first major surface 101 and a second major surface 102 opposite the first major surface 101 and separated by a thickness (t) of PCB material. The PCB 100D includes both embedded layers and a surface layer having one or more passive components or active components 103 such as logic circuits. The one or more passive components or active components 103 may include one or more resistors, capacitors, inductors, diodes, oscillators, transistors, integrated circuits, switches, terminals or the like. The PCB 100D also includes one or more power conductive layers 105 configured to provide power to and from the power semiconductor devices 120A, 120B embedded within the PCB 100D by way of vias.

In embodiments described herein, the power semiconductor devices 120A, 120B may be bonded to an electrically and thermally conductive substrate 130A, 130B, respectively. For example, the power semiconductor device 120A may be bonded the electrically and thermally conductive substrate 130A on a first surface 131A of the electrically and thermally conductive substrate 130A. Similarly, for example, the power semiconductor device 120B may be bonded the electrically and thermally conductive substrate 130B on a first surface 131B of the electrically and thermally conductive substrate 130B. The electrically and thermally conductive substrates 130A, 130B may include copper, aluminum, gold, silver, or other metals or alloys. The electrically and thermally conductive substrates 130A, 130B may include a cavity sized and shaped to receive one or more of the power semiconductor devices 120A, 120B to provide a close mating between the power semiconductor devices 120A, 120B and the respective electrically and thermally conductive substrates 130A, 130B. However, this is not a requirement as the power semiconductor devices 120A, 120B may be bonded to their respective electrically and thermally conductive substrates 130A, 130B.

The embedded power devices 110A, 110B further include electrical insulation layers 140A, 140B bonded to the electrically and thermally conductive substrates 130A, 130B. For example, the electrical insulation layer 140A may be bonded to a second surface 132A of the electrically and thermally conductive substrates 130A. Similarly, for example, the electrical insulation layer 140B may be bonded to a second surface 132B of the electrically and thermally conductive substrates 130B. The electrical insulation layers 140A, 140B may be further thermally coupled to a first copper layer 191A, 191B that may be coupled to a plurality of vias 190A, 190B, which may be further coupled to a second copper layer 192A, 192B. The first copper layers 191A, 191B, the second copper layers 192A, 192B, and the plurality of vias 190A, 190B, formed therebetween, provide thermal paths from the power semiconductor devices 120A, 120B, the thermally conductive substrates 130A, 130B, and the electrical insulation layers 140A, 140B to one or more cooling devices (not shown in FIGS. 3A-3C, but may include a vapor chamber and/or cold plate as depicted in embodiments described herein). The first copper layers 191A, 191B, the second copper layers 192A, 192B, and the plurality of vias 190A, 190B may be formed through any known methods of forming a PCB, but may be configured in a density sufficient to provide thermal paths for the power semiconductor devices and a bondable surface (e.g., the second copper layers 192A, 192B) adjacent (e.g., formed with) the second major surface 102 of the PCB 100D.

Turning to FIG. 3B, a similar PCB 100E to the PCB 100D depicted and described with reference to FIG. 3A is depicted. For brevity, only the differences between the PCB 100E depicted in FIG. 3B and the PCB 100D previously depicted and described with reference to FIG. 3A will be discussed. The PCB 100E includes a single electrical insulation layer 140 configured to extend across a layer of the PCB 100E such that the one or more electrically and thermally conductive substrates 130A, 130B are electrically isolated from the first copper layers 191A, 191B, the second copper layers 192A, 192B, and the plurality of vias 190A, 190B and the bondable surface (e.g., the second copper layers 192A, 192B) adjacent (e.g., formed with) the second major surface 102 of the PCB 100E. The plurality of vias 190 or 190A, 190B may be formed within and through portions of the PCBs 100D, 100E by any known methods of PCB fabrication. The plurality of vias 190A, 190B that extend to and adjacent with the second major surface 102 of the PCBs 102D, 102E may include pads (e.g., (e.g., the first copper layers 191A, 191B and the second copper layers 192A, 192B) that form surfaces that may be bondable to a cooling device external to the PCBs 102D, 102E.

Similarly, in FIG. 3C, PCB 100F includes a single electrical insulation layer 140 coupled to a single layer including a first copper layer 191 and a second copper layer 192 with a plurality of vias 190 positioned therebetween. The single electrical insulation layer 140 may be configured to extend across a layer of the PCB 100F such that the one or more electrically and thermally conductive substrates 130A and/or 130B are electrically isolated from the single layer including a first copper layer 191 and a second copper layer 192 with a plurality of vias 190 positioned therebetween, but thermally coupled to a larger bondable surface (e.g., the second copper layer 192) adjacent (e.g., formed with) the second major surface 102 of the PCB 100F than the bondable surface of PCBs 100D or 100E. Although not depicted in FIGS. 3A-3C, the bondable surface formed by the plurality of vias 190 or 190A and/or 190B (i.e., the second major surface 102 of the PCBs 100D, 100E, 100F), can further assist with securing the embedded power device within the PCBs 100D, 100E, 100F.

Figure 4:
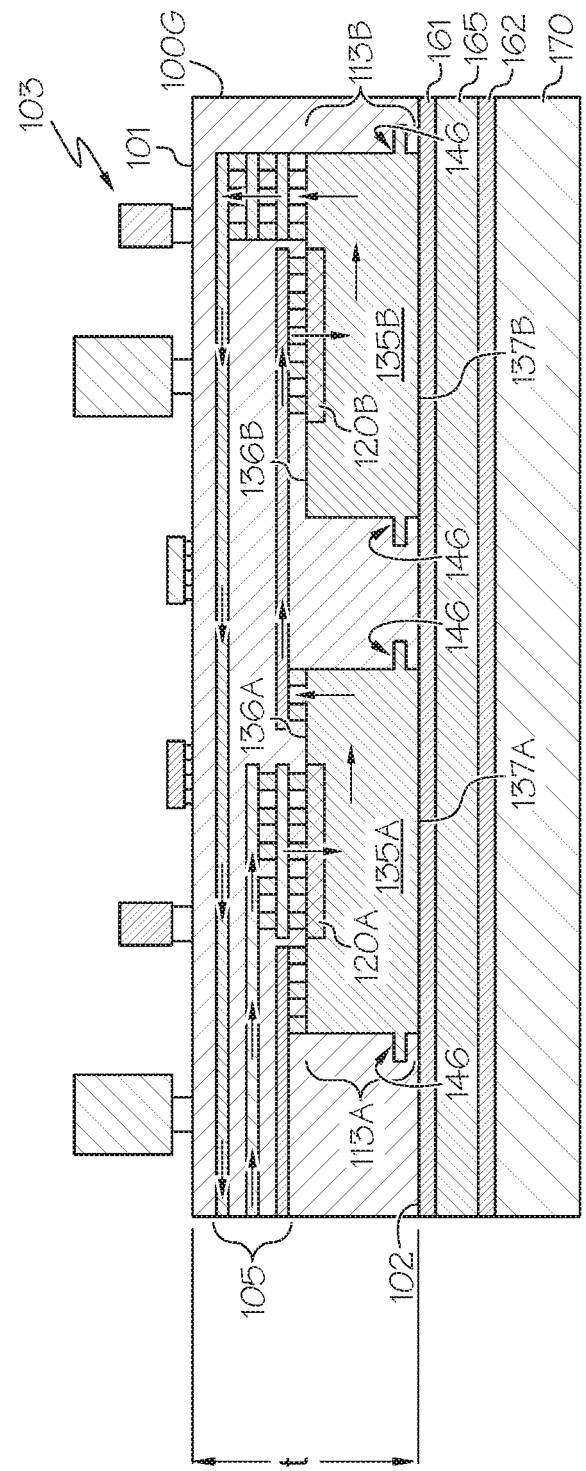
FIG. 4 schematically depicts a cross-sectional view of an electronics assembly having a printed circuit board with an embedded power device coupled to an electronic isolation layer and a cold plate, according to one or more embodiments shown and described herein.

FIG. 4 schematically depicts a cross-sectional view of an electronics assembly having a printed circuit board 100G with embedded power devices 113A, 113B coupled to an electronic isolation layer 160 and further a cold plate 170, optionally, via grease layers 161, 162 disposed therebetween. In some embodiments, the electronic isolation layer 160 may be a ceramic or other isolating but thermally conducting material and may be bonded to the bondable surfaces formed on the second major surface 102 of the PCB 100G.

The PCB 100G, like the previously discussed PCBs includes one or more embedded power semiconductor devices 120A, 120B. Unlike the previously discussed configurations of the PCBs, PCB 100G includes one or more electrically and thermally conductive substrates 135A, 135B bonded respectively to the one or more power semiconductor devices 120A, 120B. The one or more power semiconductor devices 120A, 120B may be configured within cavities of the electrically and thermally conductive substrates 135A, 135B or simply bonded to a first surface (e.g., surface 136A, 136B) of electrically and thermally conductive substrates 135A, 135B, respectively. A second surface (e.g., surface 137A, 137B) opposite the first surface (e.g., surface 136A, 136B) forms a bondable surface adjacent the second major surface 102 of the PCB 100G. In some embodiments, the electrically and thermally conductive substrates 135A, 135B include one or more flanges 146 positioned along an edge extending from the first surface (e.g., 136A, 136B) to the second surface (e.g., 137A, 137B). The flanges 146 may position and secure the embedded power devices 113A, 113B within the PCB 100G.

As further depicted in FIG. 4, since the bondable surface (s) adjacent the second major surface 102 of the PCB 100G is an electrically conductive surface, an electronic isolation layer 165 is coupled (e.g., bonded) to the bondable surface (s) adjacent the second major surface 102 of the PCB 100G. The electronic isolation layer 160 may then be further thermally coupled to a cooling device such as a cold plate 170. As referenced herein, "cold plates" may refer to heat sinks or other like device that may wick or actively move heat from the PCB that they are coupled to.

It should now be understood that the embodiments described herein are directed to various configurations of a power device embedded PCB having an improved bondable surface for connecting PCB to a cooling device and improving the extraction of heat therefrom. In embodiments, a power device embedded PCB includes a printed circuit board having a first major surface separated by a thickness and opposite a second major surface and an embedded power device. The embedded power device may include a power semiconductor device, an electrically and thermally conductive substrate bonded to the power semiconductor device along a first surface and bonded to an electrical insulation layer on a second surface opposite the first surface and a thermally conductive substrate bonded to the electrical insulation layer on a surface opposite the bonded electrically and thermally conductive substrate. The power semiconductor device, the electrically and thermally conductive substrate, the electrical insulation layer, and the thermally conductive substrate are embedded within the printed circuit board such that they are disposed between the first major surface and the second major surface. The thermally conductive substrate forms a bondable surface adjacent the second major surface of the printed circuit board.

The terminology used herein is for the purpose of describing particular aspects only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. The term "or a combination thereof" means a combination including at least one of the foregoing elements.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A power device-embedded PCB comprising:
  a printed circuit board having a first major surface separated by a thickness and opposite a second major surface; and
  an embedded power device comprising:
    a power semiconductor device;
    an electrically and thermally conductive substrate bonded to the power semiconductor device along a first surface of the electrically and thermally conductive substrate and bonded to an electrical insulation layer on a second surface of the electrically and thermally conductive substrate opposite the first surface; and
    a thermally conductive substrate bonded to the electrical insulation layer on a surface opposite the electrically and thermally conductive substrate, wherein:
      the power semiconductor device, the electrically and thermally conductive substrate, the electrical insulation layer, and the thermally conductive substrate are disposed within the printed circuit board between the first major surface and the second major surface, and the thermally conductive substrate forms a bondable surface adjacent the second major surface of the printed circuit board.

2. The power device-embedded PCB of claim 1, further comprising one or more conductive power layers disposed within the printed circuit board and electrically coupled to the power semiconductor device between the first major surface of the printed circuit board and the first surface of the electrically and thermally conductive substrate.

3. The power device-embedded PCB of claim 1, further comprising a second embedded power device disposed with the printed circuit board and positioned adjacent the embedded power device, wherein a second power semiconductor device of the second embedded power device is electrically coupled to the power semiconductor device of the embedded power device.

4. The power device-embedded PCB of claim 3, wherein the electrical insulation layer extends between the embedded power device and the second embedded power device.

5. The power device-embedded PCB of claim 3, wherein the thermally conductive substrate extends between the embedded power device and the second embedded power device.

6. The power device-embedded PCB of claim 1, wherein the electrically and thermally conductive substrate, the electrical insulation layer, and the thermally conductive substrate define a direct bonded insulation device.

7. The power device-embedded PCB of claim 6, wherein the direct bonded insulation device is at least one of a direct bonded copper substrate, a direct bonded aluminum device, or an active metal bonding substrate.

8. The power device-embedded PCB of claim 1, wherein the electrical insulation layer has a cross-sectional width wider than a cross-sectional width of the electrically and thermally conductive substrate.

9. The power device-embedded PCB of claim 1, wherein the first major surface of the printed circuit board includes one or more passive components or one or more active components.

10. The power device-embedded PCB of claim 1, further comprising at least one of a vapor chamber or a cold plate, wherein the at least one of the vapor chamber or the cold plate is bonded to the thermally conductive substrate of the embedded power device.

11. The power device-embedded PCB of claim 1, wherein the power semiconductor device is a power device having a power rating greater than or equal to 40 kW.

12. The power device-embedded PCB of claim 1, wherein the electrical insulation layer includes a ceramic material.

13. A power device-embedded PCB comprising:
a printed circuit board having a first major surface separated by a thickness and opposite a second major surface; and
an embedded power device comprising:
a power semiconductor device;
an electrically and thermally conductive substrate bonded to the power semiconductor device along a first surface of the electrically and thermally conductive substrate and bonded to an electrical insulation layer on a second surface of the electrically and thermally conductive substrate opposite the first surface; and a plurality of vias extending from the electrical insulation layer to the second major surface of the printed circuit board whereby a bondable surface adjacent the second major surface of the printed circuit board is formed, wherein:
the power semiconductor device, the electrically and thermally conductive substrate, the electrical insulation layer, and the plurality of vias are disposed within the printed circuit board between the first major surface and the second major surface.

14. The power device-embedded PCB of claim 13, further comprising one or more conductive power layers disposed within the printed circuit board and electrically coupled to the power semiconductor device between the first major surface of the printed circuit board and the first surface of the electrically and thermally conductive substrate.

15. The power device-embedded PCB of claim 13, further comprising a second embedded power device disposed with the printed circuit board and positioned adjacent the embedded power device, wherein a second power semiconductor device of the second embedded power device is electrically coupled to the power semiconductor device of the embedded power device.

16. The power device-embedded PCB of claim 13, wherein the electrically and thermally conductive substrate, the electrical insulation layer, and the plurality of vias define a direct bonded insulation device, and the direct bonded insulation device is at least one of a direct bonded copper substrate, a direct bonded aluminum device, or an active metal bonding substrate.

17. The power device-embedded PCB of claim 13, wherein the electrical insulation layer has a cross-sectional width wider than a cross-sectional width of the electrically and thermally conductive substrate.

18. The power device-embedded PCB of claim 13, wherein the first major surface of the printed circuit board includes one or more passive components or one or more active components.

19. The power device-embedded PCB of claim 13, further comprising at least one of a vapor chamber or a cold plate, wherein the at least one of the vapor chamber or the cold plate is bonded to the bondable surface adjacent the second major surface of the printed circuit board.

20. A power device-embedded PCB comprising:
a printed circuit board having a first major surface separated by a thickness and opposite a second major surface; and
an embedded power device comprising:
a power semiconductor device; and
an electrically and thermally conductive substrate bonded to the power semiconductor device along a first surface of the electrically and thermally conductive substrate and a second surface of the electrically and thermally conductive substrate opposite the first surface forms a bondable surface adjacent the second major surface of the printed circuit board, wherein the electrically and thermally conductive substrate includes a flange positioned along an edge extending from the first surface to the second surface, wherein:
the power semiconductor device and the electrically and thermally conductive substrate are disposed within the printed circuit board between the first major surface and the second major surface; and
one or more conductive power layers disposed within the printed circuit board between the first major surface and the first surface of the electrically and thermally conductive substrate and electrically coupled to the power semiconductor device along the first surface of the embedded power device.

* * * * *

UNITED STATES PATENT AND TRADEMARK OFFICE
CERTIFICATE OF CORRECTION

| | | |
|---|---|---|
| PATENT NO. | : 11,328,980 B2 | Page 1 of 1 |
| APPLICATION NO. | : 16/925953 | |
| DATED | : May 10, 2022 | |
| INVENTOR(S) | : Feng Zhou and Shohei Nagai | |

It is certified that error appears in the above-identified patent and that said Letters Patent is hereby corrected as shown below:

In the Specification

In Column 1, Line(s) 43, after "structure", delete "is" and insert --are--, therefor.

In the Claims

In Column 12, Line(s) 52-54, Claim 20, delete "of the electrically and thermally conductive substrate of the electrically and thermally conductive substrate" and insert --of the electrically and thermally conductive substrate--, therefor.

Signed and Sealed this
Thirteenth Day of September, 2022

Katherine Kelly Vidal
*Director of the United States Patent and Trademark Office*